United States Patent [19]

Ellenberger et al.

[11] Patent Number: 4,761,301

[45] Date of Patent: Aug. 2, 1988

[54] ELECTRICAL INSULATOR FOR A PLASMA ENHANCED CHEMICAL VAPOR PROCESSOR

[75] Inventors: Charles E. Ellenberger, Elko, Nev.; Hayden K. Piper, Hillsboro, Oreg.

[73] Assignee: Pacific Western Systems, Inc., Mountain View, Calif.

[21] Appl. No.: 894,726

[22] Filed: Aug. 8, 1986

Related U.S. Application Data

[63] Continuation of Ser. No. 542,764, Oct. 17, 1983, abandoned, which is a continuation-in-part of Ser. No. 311,758, Oct. 15, 1981, abandoned.

[51] Int. Cl.$^4$ .............................................. C23C 16/50
[52] U.S. Cl. ..................................... 427/39; 427/38; 118/723; 118/728; 118/50.1; 174/212
[58] Field of Search .................. 174/211, 212; 427/38, 427/39; 118/723, 50.1, 728

[56] References Cited

U.S. PATENT DOCUMENTS

| | | | |
|---|---|---|---|
| 3,764,838 | 10/1973 | Charpentier | 174/212 |
| 4,125,742 | 11/1978 | Rabinowitz | 174/211 |
| 4,223,048 | 9/1980 | Engle | 427/39 |
| 4,491,606 | 1/1985 | Rosler | 118/723 |

*Primary Examiner*—Richard R. Bueker
*Attorney, Agent, or Firm*—Harry E. Aine

[57] ABSTRACT

In a plasma enhanced chemical vapor processing apparatus first and second sets of electrodes are electrically insulated one from the other via the intermediary of a plurality of insulator bodies. Each of the insulator bodies includes a recessed portion for extending the electrical path length over the surface of the insulator to minimize shorting of the insulators in use. The recess in the insulator body is of generally L-shaped cross section including a radially inwardly directed recessed portion intersecting with an axially directed recess portion. The axially directed portion of the recess is shielded from the plasma discharge, thereby reducing the probability of deposition of conductive material thereon which could otherwise result in shorting of the insulator member. The axial recesses extend into the insulator body from opposite ends thereof.

3 Claims, 1 Drawing Sheet

U.S. Patent  Aug. 2, 1988  4,761,301
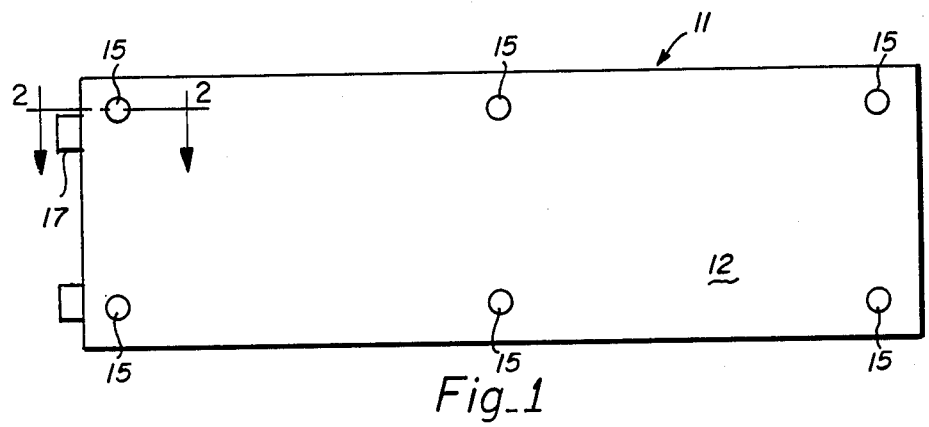
Fig_1
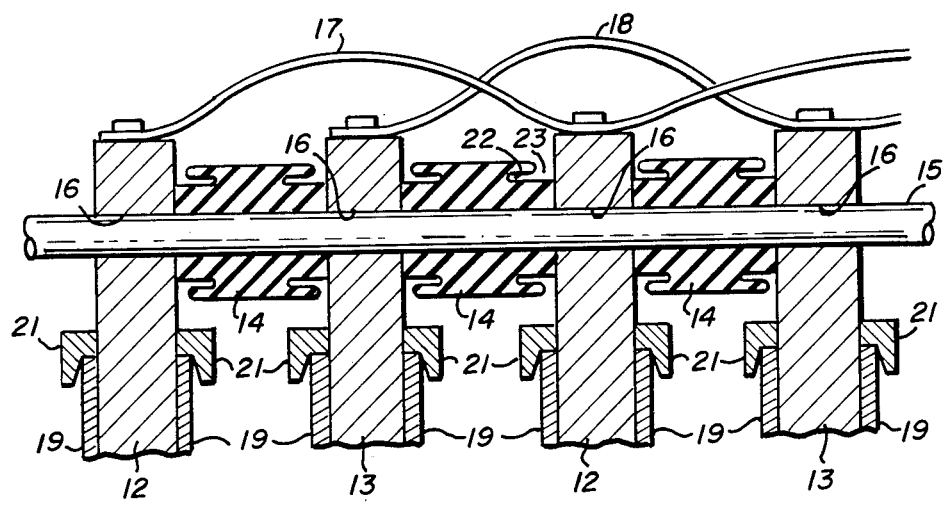
Fig_2

ELECTRICAL INSULATOR FOR A PLASMA ENHANCED CHEMICAL VAPOR PROCESSOR

This application is a continuation of application Ser. No. 542,764, filed Oct. 17, 1983, now abandoned, which in-turn was a continuation-in-part application of parent application Ser. No. 311,758, filed Oct. 15, 1981, now abandoned.

BACKGROUND OF THE INVENTION

The present invention relates in general to plasma enhanced chemical vapor processors and more particularly to an improved electrical insulator for insulating the electrodes thereof.

DESCRIPTION OF THE PRIOR ART

Heretofore, plasma enhanced chemical vapor processors have included first and second sets of interleaved electrodes spaced apart and electrically insulated one from the other via the intermediary of hollow cylindrical insulator bodies, as of ceramic, carried upon an insulative rod passing transversely of the interleaved electrodes. A plasma enhanced chemical vapor processor is disclosed and claimed in U.S. Pat. No. 4,223,048 issued Sept. 16, 1980.

In the plasma enhanced chemical vapor processor, workpieces, such as semiconductive wafers, are positioned vertically adjacent the vertically interleaved electrodes. The electrodes are excited with a radio frequency electrical potential. The interleaved electrodes are disposed within an evacuable envelope that has been evacuated and filled with a suitable chemical vapor such as silane, nitrogen, nitrous oxide, oxygen or the like depending upon the chemical processing to be performed.

The evacuated envelope, as of quartz, is disposed within the interior of a hollow cylindrical heater or furnace for heating the wafers and the chemical vapor to a suitable reaction temperature as of 350–600 degrees C depending upon the nature of the processing to be performed. The chemical vapors are caused to flow axially through the evacuable tube and through the electrical plasma discharge established in the processing gaps between adjacent electrodes at subatmospheric pressure to produce chemically active vapor products of the plasma discharge which interact with the faces of the wafers facing into the processing gaps for processing of the wafers.

One of the problems with the prior art insulator is that under certain processing conditions, such as those employed for depositing polysilicon on the wafers, the polysilicon is also deposited upon the insulator bodies. The polysilicon is conductive and forms a conductive path across the exterior surface of the cylindrical insulator producing a short between the insulated electrodes. This electrical short is accompanied by arcing and serves to perturb the uniformity of the plasma discharge in the processing gap producing a non-uniform deposition on the wafers. Also, if the shorting is excessive, it can blow a fuse or otherwise disable the RF plasma generator. Under certain deposition conditions, a conductive path can form on the insulator body in a relatively short time such as during a single processing run. Thus, it is desired to obtain an improved insulator body which is less prone to formation of conductive paths thereacross.

SUMMARY OF THE PRESENT INVENTION

The principal object of the present invention is the provision of an improved electrical insulator for a plasma enhanced chemical vapor processor.

In one feature of the present invention, first and second electrodes of a plasma enhanced chemical vapor processor are insulated one from the other via the intermediary of an electrically insulative body having a reentrant narrow axial recess formed therein for preventing the plasma from reaching into the axial recess to deposit conductive material across the surface of the insulator between the first and second electrodes, whereby the insulator is rendered less sensitive to electrical shorts.

In another feature of the present invention, the insulator body includes a radially directed narrow recess intersecting with the axially direct recess to exclude the plasma discharge and resultant deposition within the recessed portion of the insulator body.

Other features and advantages of the present invention will become apparent upon a perusal of the following specification taken in connection with the accompanying drawings wherein:

BRIEF DESCRIPTION OF THE DRAWINGS

FIG. 1 is a side elevational view of a set of interleaved electrodes for a plasma enhanced chemical vapor processor, and FIG. 2 is an enlarged sectional view of a portion of the structure of FIG. 1 taken along line 2—2 in the direction of the arrows.

DESCRIPTION OF THE PREFERRED EMBODIMENTS

Referring now to FIGS. 1 and 2, there is shown an electrode structure 11 for a plasma enhanced chemical vapor processor of the type disclosed and claimed in the aforecited U.S. Pat. No. 4,223,048, the disclosure of whichis hereby incorporated herein by reference in its entirety. More particularly, the electrode structure 11 includes an array of rectangular electrode plates 12 and 13, as of graphite, disposed with their major faces in mutually opposed relation and with one set of electrode plates 12 being interleaved with a second set of electrode plates 13. Normals to the major faces of the electrodes 12 and 13 are parallel to the horizontal plane. The electrodes 12 and 13 are held together in spaced apart relation via the intermediary of a plurality of hollow cylindrical insulator bodies 14, as of alumina, threaded on a transverse insulative rod 15, as of alumina. The rod 15 passes through aligned bores 16 in the electrode plates 12 and 13. The electrode structure 11 includes a rod 15 and insulator assembly at each corner with two rods and insulators assemblies disposed centrally of the array of electrode plates 12 and 13. The electrode plates 12 and 13, together with their insulator bodies 14, are held in compression by means of suitable fastening devices affixed to the opposite ends of the rods 15.

One set of electrodes 12 is electrically interconnected by means of a conductive strap 17, whereas the other set of electrodes 13 is conductively connected via a second strap 18. The RF electrical potential is applied across the straps for producing the electrical potential across the processing gaps defined by the spaces between the interleaved electrodes 12 and 13. Semiconductor wafers 19 are positioned in the processing gas and are held vertically and adjacent to the respective electrodes 12 and 13 via bosses 21.

Insulator bodies 14 each include recesses of generally L-shaped cross section having a narrow axially directed portion 22 intersecting with a narrow radially directed portion 23. In a typical example, the axially directed portion 22 has an axial length as of 0.15" and a height or width of 0.030" to 0.040" also the height of the radially directed portion has a dimension of 0.030" and a radial length of 0.047" to 0.042". The insulator body has an overall axial length of 0.562" and an outside diameter of 0.5".

When depositing polysilicon material, the wafers and the electrodes, including the insulator, are inserted into a heated zone of the deposition chamber and are heated to a chemical vapor deposition temperature, generally in excess of 350 degrees C. The chamber is evacuated to a pressure of approximately two torr with a substantial flow of a suitable silicon containing chemical vapor such as, for example, silane.

Under these operating conditions, the plasma discharge has a "dark space" associated therewith, i.e., a dark region of the glow discharge adjacent the electrodes which has a thickness of approximately 0.04". It is believed that the mechanism by which the recesses serve to substantially inhibit the deposition of the conductive polysilicon material over the entire insulator body is due to the fact that the recesses 22 and 23 are narrow, i.e., they have a height or a narrow dimension on the order of less than the thickness of the "dark space" such that the plasma discharge does not propagate into the recesses.

As a result, the conductive polysilicon material is not deposited on the interior wall of the axially recessed portion 22, thereby substantially prolonging the operating life of the insulator without subjecting the same to a cleaning process to remove the conductive material.

Also, it is believed that the relatively long axial length of the recess portion 22, while operating at a chemical vapor deposition temperature, does not experience substantial coating or deposition because the discharge, at the entrance to the radial portion 23 of the recess serves to deplete the gases of the silicon component, i.e., the silicon component is plated out at the entrance to the radial recess portion thus depleting the gas of the conductive components so that it is not plated out by mere chemical vapor deposition on the inside of the axial recess portion 22.

Thus, in a manner of speaking, the axially directed reentrant recess portion 22 is partially shielded from the plasma discharge region for reducing the amount of deposition of conductive material on the walls of the recess portion 22 of the insulator body 14. In this manner, the electrical path length across the insulator is substantially increased or extended to extend the operating life of the insulator assembly before a conductive short is formed thereacross.

By providing the recesses in the insulator member 14, the processor operating time is substantially increased before the insulator assembly is shorted and, more particularly, it is increased to a period of time longer than the average run for deposition of material on the semiconductive wafers 19 such that by cleaning and replacing the insulator members 14 between runs, the uniformity of the deposition of the conductive material upon the wafers is substantially improved. In addition, the likelihood of a short or a blowout of the RF power supply is greatly reduced.

What is claimed is:
1. In a method for plasma enhanced chemical vapor deposition of an electrically conductive material the steps of:
disposing first and second sets of interleaved electrodes in an evacuable envelope;
loading semiconductive wafers into the processing gaps defined between adjacent interleaved electrodes of said first and second sets with one major face of each wafer being disposed facing an adjacent electrode and the other major face of each wafer facing into the processing gap defined between adjacent ones of said first and second electrodes;
evacuating said envelope to subatmospheric pressure;
introducing a chemical vapor at subatmospheric pressure into said envelope;
electrically insulating said first and second sets of interleaved electrodes by means of an electrical insulator body for physically supporting said electrodes in electrically insulatively spaced relation one from the other;
providing a pair of first narrow annular axial recess portions in said insulator body with each of said first narrow annular axial recess portions being defined by a relatively narrow space between a pair of relatively broad mutually opposed radially spaced apart annular side wall portions of said insulator body, said annular broad side wall portions having axes of revolution extending generally axially of said insulator body and in a direction across said processing gap defined between adjacent interleaved electrodes, and each of said first narrow annular axial recess portions extending into said insulator body and toward the other from opposite ends of said insulator body;
providing a pair of second annular recesses between the ends of said insulator body and the adjacent electrodes and each of said second recesses extending radially outwardly of said body to the outer periphery thereof at opposite ends of said insulator body;
intersecting said second radial recesses with respective ones of said first narrow axial recesses, wherein said intersecting step results in the insulator body being provided with combination recesses of generally L-shaped cross-section including narrow annular axial reentrant recessed portions;
heating said electrodes, workpieces, and insulator body to a chemical vapor deposition temperature;
establishing an electrical plasma discharge at subatmospheric pressure in the processing gap between said interleaved first and second sets of electrodes to produce chemically active vapor products of said plasma discharge; and
chemically interacting said chemically active vapor products with said major faces of said wafers which face into the processing gap for depositing an electrically conductive material on said wafers while partially shielding said narrow annular axial reentrant recessed portions from said plasma discharge for substantially inhibiting deposition of the conductive material on the interior walls of said narrow annular axial reentrant recessed portions in said insulator body.

2. In an apparatus for depositing an electrically conductive film by plasma enhanced chemical vapor deposition and including a pair of spaced apart, generally parallel electrically conductive plates for forming a plasma discharge region therebetween, the improvement comprising;

electrically insulative spacer means operably disposed within said plasma discharge region inbetween said conductive plates for spacing apart said conductive plates and for electrically insulating one plate from the other plate said insulative spacer having one end disposed against one conductive plate and an opposite end disposed against another conductive plate, said insulative spacer disposed such that its axis is defined as running from said one end to said opposite end;

said insulative spacer means having a narrow annular axial recess in said insulative spacer means, said narrow annular axial recess being defined by a relatively narrow space between a pair of relatively broad mutually opposed radially spaced annular side wall portions of said insulative spacer means, said annular broad side wall portions of said insulator means having axes of revolution extending generally axially of said insulative spacer means, said annular axial recess being elongated and extending axially of said spacer means from said one end toward the opposite end of the spacer means;

said insulative spacer means, as operably disposed inbetween said electrically conductive plates, defining with one adjacent electrically conductive plate an annular radially outwardly extending recess between an end of said spacer means and the adjacent one of said electrically conductive plates, said radial recess extending radially out to and around the entire outer circumference of said spacer means;

said radial recess intersecting with said axial recess at one end of said spacer means to define a combination recess of generally L-shaped cross section including a narrow annular axial reentrant recessed portion; and said combination recess being disposed and proportioned for inhibiting the depostion of electrically conductive film material across the entire length of said insulative spacer means by partially shielding said narrow annular axial reentrant recessed portion from said plasma discharge region for inhibiting plasma enhanced chemical vapor deposition within said axial recess, thereby inhibiting a breakdown of the plasma discharge resulting in longer deposition runs, more deposition runs and increased productivity between changing of said electrically insulative spacer means.

3. The apparatus of claim 2 wherein pairs of said combination radial recesses are disposed at opposite ends of said insulative spacer means with a pair of said narrow annular axial reentrant recessed portions extending axially toward each other from opposite ends of said insulative spacer means.

* * * * *